(12) United States Patent
Schluer (10) Patent No.: US 10,306,814 B2
(45) Date of Patent: May 28, 2019

(54) HEAT DISSIPATION IN POWER ELECTRONIC ASSEMBLIES

(71) Applicant: ABB Schweiz AG, Baden (CH)

(72) Inventor: Tobias Schluer, Zollikofen (CH)

(73) Assignee: ABB Schweiz AG, Baden (CH)

(*) Notice: Subject to any disclaimer, the term of this patent is extended or adjusted under 35 U.S.C. 154(b) by 172 days.

(21) Appl. No.: 15/265,354

(22) Filed: Sep. 14, 2016

(65) Prior Publication Data
US 2017/0079159 A1  Mar. 16, 2017

(30) Foreign Application Priority Data

Sep. 15, 2015 (EP) ..................... 15185334

(51) Int. Cl.
  *H02M 1/08*  (2006.01)
  *H02M 7/00*  (2006.01)
  (Continued)

(52) U.S. Cl.
  CPC .......... *H05K 7/209* (2013.01); *H01L 23/642* (2013.01); *H01L 25/115* (2013.01); *H02M 1/08* (2013.01);
  (Continued)

(58) Field of Classification Search
  CPC . G06F 1/181–1/182; H05K 7/20218–7/20381;
  (Continued)

(56) References Cited

U.S. PATENT DOCUMENTS 5,579,217 A * 11/1996 Deam ................ H01L 23/52
                                                    174/72 B
6,219,266 B1  4/2001 Pfauser
(Continued)

FOREIGN PATENT DOCUMENTS

EP  1445853 A2  8/2004
EP  1445853 A3  1/2006

OTHER PUBLICATIONS

European Patent Office, Extended Search Report issued in corresponding Application No. 15185334.8, dated Mar. 30, 2016, 6 pp.

Primary Examiner — Jayprakash N Gandhi
Assistant Examiner — Razmeen Gafur
(74) Attorney, Agent, or Firm — Taft Stettinius & Hollister LLP; J. Bruce Schelkopf (57) ABSTRACT

A three-phase two-level power electronics assembly is disclosed in one form including a thermally conductive base plate, a heat dissipation unit, mounted on a first face of the base plate, connectors for three-phase AC output, chopper DC outputs, and two poles of a DC link, and a set of power electronics devices mounted on a second face of the base plate, whereby the power electronic devices are arranged within the three-phase two-level power electronics assembly in rows to provide a three phase AC output as well as chopper DC outputs and connected to the respective connectors, whereby the rows connected to the three-phase AC output and the rows connected to the chopper DC outputs are alternately arranged on the base plate. Also disclosed is a power converter, in particular a static power converter, having at least one three-phase two-level power electronics assembly as specified above.

20 Claims, 3 Drawing Sheets

(51) Int. Cl.
*H05K 7/14* (2006.01)
*H05K 7/20* (2006.01)
*H01L 23/64* (2006.01)
*H01L 25/11* (2006.01)

(52) U.S. Cl.
CPC .......... *H02M 7/003* (2013.01); *H05K 7/1432* (2013.01); *H01L 2924/13055* (2013.01); *H01L 2924/19041* (2013.01); *H01L 2924/3025* (2013.01); *H01L 2924/30107* (2013.01)

(58) Field of Classification Search
CPC ........................ H05K 7/20409–7/20418; H05K 7/20009–7/202; H05K 7/209; H05K 7/1432; H01L 23/367–23/3677; H01L 23/473; H01L 23/46–23/467; H01L 23/642; H01L 25/115; H01L 2924/13055; H01L 2924/19041; H01L 2924/30107; H01L 2924/3025; H02M 1/08; H02M 7/003; H02M 2001/008
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | |
|---|---|---|---|---|
| 2003/0031038 A1* | 2/2003 | Shirakawa | ............ | H02M 7/003 363/144 |
| 2005/0152101 A1* | 7/2005 | Rodriguez | ......... | H05K 7/20272 361/605 |
| 2005/0270745 A1* | 12/2005 | Chen | .................. | H01F 27/2804 361/707 |
| 2009/0040724 A1* | 2/2009 | Nishikimi | .......... | H05K 7/20927 361/699 |
| 2009/0294195 A1* | 12/2009 | Otsuka | ................... | B60K 6/405 180/65.275 |
| 2010/0089641 A1* | 4/2010 | Esmaili | ................ | H05K 7/1432 174/70 B |
| 2012/0008357 A1* | 1/2012 | Azuma | .................... | B60K 6/28 363/131 |
| 2012/0306213 A1* | 12/2012 | Hubbers | ................ | H03K 17/16 290/55 |
| 2013/0044434 A1* | 2/2013 | Sharaf | ................ | H05K 7/20927 361/702 |
| 2013/0271941 A1* | 10/2013 | Guan | ....................... | H05K 7/18 361/811 |
| 2014/0029200 A1* | 1/2014 | Annacchino | ....... | H05K 7/20936 361/700 |
| 2014/0110380 A1* | 4/2014 | Kamath | ................. | B23K 10/00 219/121.39 |
| 2014/0355212 A1* | 12/2014 | Campbell | .......... | H05K 7/20236 361/699 |
| 2015/0070955 A1* | 3/2015 | Tokuyama | .............. | H01L 23/36 363/131 |
| 2015/0305188 A1* | 10/2015 | Maeda | ................. | H05K 7/1432 361/728 |
| 2015/0305189 A1* | 10/2015 | Strader | ................. | H01L 23/367 361/707 |
| 2015/0342087 A1* | 11/2015 | Donth | ................ | H05K 7/20918 361/695 |
| 2016/0120069 A1* | 4/2016 | Raassina | ............ | H05K 7/20509 361/697 |
| 2016/0128236 A1* | 5/2016 | Pietrantonio | .......... | H05K 7/209 361/702 |
| 2016/0165715 A1* | 6/2016 | Kahrimanovic | ..... | H05K 1/0203 361/709 |
| 2016/0192495 A1* | 6/2016 | Nakamura | .......... | H01L 23/5227 361/783 |
| 2017/0033593 A1* | 2/2017 | Kamizuma | ........... | H02M 7/217 |
| 2017/0105321 A1* | 4/2017 | Tokuyama | ......... | H05K 7/20927 |
| 2017/0127540 A1* | 5/2017 | You | ...................... | H05K 5/0026 |
| 2017/0302191 A1* | 10/2017 | Nakatsu | ................. | B60L 11/14 |

\* cited by examiner

HEAT DISSIPATION IN POWER ELECTRONIC ASSEMBLIES

TECHNICAL FIELD

The present invention relates to the technical area of power electronics. In particular, the present invention relates to the area of three-phase two-level power electronics assemblies comprising a thermally conductive base plate, a heat dissipation unit, mounted on a first face of the base plate, connectors for three-phase AC output, chopper DC outputs, and two poles of a DC link, and a set of power electronic devices mounted on a second face of the base plate, whereby the power electronic devices are arranged within the three-phase two-level power electronics assembly in rows to provide a three phase AC output as well as chopper DC outputs and connected to the respective connectors. Even more particular, the present invention relates to the area of power converters comprising such three-phase two-level power electronics assemblies.

BACKGROUND ART

Such three-phase two-level power electronics assemblies commonly have a design comprising a thermally conductive base plate with two faces. On a first face of the base plate, a heat dissipation unit is mounted, and a set of power electronic devices is mounted on a second face of the base plate. The power electronic devices are typically arranged within the three-phase two-level power electronics assembly in rows according to their functions to form logical entities located closely on the base plate.

According to a typical usage of the three-phase two-level power electronics assemblies, connectors for a three phase AC output as well as two chopper DC outputs are provided, as well as connectors for two poles of a DC link. Such a design of the three-phase two-level power electronics assembly is e.g. used in power converters, in particular in static power converters. The power converters, in particular static power converters, are often built as compact and integrated systems to reach high possible performances with increased voltages and switching frequencies. A typical usage of such power converters is in the area of transportation, e.g. in electrically driven locomotives and trains as well as electric railcars or power coaches. In this area, the power converter is often referred to as traction converter.

For the use e.g. in the power converters, the power electronic devices are typically arranged in half-bridges according to their functions, whereby each half-bridge implements a switching function. As discussed here, the power electronic devices are connected to provide a three phase AC output as well as chopper DC outputs at the respective connectors. Because of needs e.g. for electrical connections, the half-bridges are typically arranged in parallel rows on the second face of the base plate.

The power electronic devices refer to electronic components comprising at least one power semiconductor. The power semiconductors typically comprise power diodes and/or power transistors, in particular Insulated-gate bipolar transistors (IGBT). In simple implementations, the power electronic devices comprise IGBTs and power diode, which are chosen and arranged according to the functions of the half-bridges, and which are directly mounted on the base plate. However, depending on in particular voltage and/or current carrying capabilities, it can be required to combine multiple of these power semiconductors in parallel and/or in series. Accordingly, the power semiconductors can be provided in power semiconductor modules, which can be mounted as power electronic devices.

The power semiconductor modules can be formed depending on their functions by different groups of power semiconductors. For Example IGBT modules and diode modules are known in the Art, whereby the IGBT modules comprise IGBTs and power diodes, and the diode modules comprise power diodes. Furthermore, the IGBT modules can implement different functionality depending on the type, number, arrangement, or others of the IGBTs. In a typical design of power semiconductor modules, the power semiconductor modules can be provided as single, double or six packs modules depending on the number of implemented switches. Still further, it is also possible to combine different power semiconductor modules and provide these combined power semiconductor modules as power electronic devices.

In order to operate the power electronic devices, in particular the power transistors, the three-phase two-level power electronics assembly comprises at least one control connector, typically provided as gate connector.

The two poles of the DC link are connected with a common DC bus for the positive and negative pole. The DC link serves as power source for the three-phase two-level power electronics assembly. Hence, the two poles of the DC link are connected to the power electronic devices.

In the area of power electronics, heating is usually an important issue. Heat is generated by the power semiconductors and also by resistive components, or the power semiconductor modules comprising these components. In particular in air-cooled three-phase two-level power electronics assemblies, heating of the components can limit its function and lifetime. Hence, when excessive heating occurs, the power semiconductor devices can be altered and destroyed before end of their designated lifetime. This also increases maintenance of the devices, where the power semiconductor devices are employed. Typically, e.g. in a power converter, multiple power semiconductor devices are used. The failure of already one of the power semiconductor devices can make the entire device unusable. Accordingly, a device with numerous power semiconductor devices has typically a low reliability and requires frequent maintenance.

To dissipate heat, the power semiconductors are typically mounted directly on the base plate. Accordingly, heat generated in the electrical components can be directly dissipated from the second face of the base plate through the base plate to its first face and the heat dissipation unit mounted thereon.

It is also known in the Art to provide cooling mechanisms in order to obtain an adequate availability of the power semiconductor devices and an increased life cycle. A powerful cooling mechanism is water cooling, which requires an installation of a full water circulation circuit, and which is therefore not suitable for all installations. Also in other cases it can be preferred not to use water-cooling. However, when using water cooling, heating can usually be controlled in an efficient and powerful way, which allows high integration of three-phase two-level power electronics assemblies.

In the case of air-cooled three-phase two-level power electronics assemblies, the heat dissipation unit usually comprises cooling rips. To enhance cooling efficiency, fresh air can be provisioned to the three-phase two-level power electronics assemblies. However, a desired integration cannot always be achieved because of insufficient dissipation of generated heat.

DISCLOSURE OF INVENTION

It is an object of the present invention to provide a three-phase two-level power electronics assembly and a power converter comprising such three-phase two-level power electronics assemblies, which allow for high integration of used power electronic devices, and which enables an efficient cooling of its power electronic devices to increase lifetime of the power electronic devices and reduce maintenance for the three-phase two-level power electronics assembly and the power converter comprising such three-phase two-level power electronics assemblies.

This object is achieved by the independent claims. Advantageous embodiments are given in the dependent claims.

In particular, the present invention provides a three-phase two-level power electronics assembly comprising a thermally conductive base plate, a heat dissipation unit, mounted on a first face of the base plate, connectors for three-phase AC output, chopper DC outputs, and two poles of a DC link, and a set of power electronic devices mounted on a second face of the base plate, whereby the power electronic devices are arranged within the three-phase two-level power electronics assembly in rows to provide a three phase AC output as well as chopper DC outputs and connected to the respective connectors, and the rows connected to the three-phase AC output and the rows connected to the chopper DC outputs are alternately arranged on the base plate.

The present invention also provides a power converter, in particular a static power converter, comprising at least one three-phase two-level power electronics assembly as specified above.

The basic idea of the invention is to provide the three-phase two-level power electronics assembly with an arrangement of the rows of power semiconductor devices, which is optimized for cooling purposes and profits from an optimized heat spreading. Since heat generation of the rows of semiconductor devices to provide the three phase AC output and the rows of semiconductor devices to provide the chopper DC outputs is different, heat generated in the semiconductor devices can be efficiently distributed within the three-phase two-level power electronics assembly. Hence, the heat can be dissipated directly to neighboring semiconductor devices as well as to the based plate, which can dissipate heat based on the local heating of the rows of different semiconductor devices. Hence, heat generated in the electrical components can be directly dissipated from the second face of the base plate through the base plate to its first face with the heat dissipation unit. Furthermore, heat generation of the rows of different semiconductor devices is typically separated in time, since the different semiconductor devices carry the current at different times, which further improves the capability of locally dissipating heat in the three-phase two-level power electronics assembly. A further source of heat can be resistors provided to operate the power semiconductors.

Accordingly, also in air-cooled three-phase two-level power electronics assemblies, heating of the components can be improved to increase lifetime and to reduce maintenance. Altering and destruction of the power semiconductor devices before end of their designated lifetime due to excessive heating can be reduced or avoided. Also maintenance of the devices, where the power semiconductor devices are employed, can be reduced, since unpredicted end of life can be reduced or avoided. Accordingly, three-phase two-level power electronics assemblies and devices with at least one three-phase two-level power electronics assembly with numerous power semiconductor devices with increased reliability and reduced need for maintenance can be provided. Also the integration of power electronic devices on the three-phase two-level power electronics assemblies and devices, e.g. power converters, comprising the three-phase two-level power electronics assemblies can be improved to reach highest possible performance with increased voltages and switching frequencies.

The power electronic devices are typically arranged in half-bridges according to their functions, whereby each half-bridge implements at least a switching function. In the present case, the power electronic devices are arranged and connected to provide a three phase AC output as well as chopper DC outputs at the respective connectors. Hence, each row of power electronic devices implements a half-bridge, so that the half-bridges are arranged in parallel rows on the second face of the base plate.

The power electronic devices refer to electronic components comprising at least one power semiconductor. The power electronic devices can comprise a single power semiconductor, or a group of power semiconductors, which together implement a function defining the power electronic devices. The number and arrangement of the power semiconductors, e.g. in series or in parallel, can be chosen e.g. depending on desired voltage and/or current carrying capabilities. In one embodiment, the power electronic devices are directly mounted on the base plate.

The DC link serves as power source for the three-phase two-level power electronics assembly. Hence, the two poles of the DC link are connected as source to the power electronic devices.

According to a modified embodiment of the invention the heat dissipation unit is an air cooling heat dissipation unit.

According to a modified embodiment of the invention the set of power electronic devices comprises power transistors, in particular IGBTs, and power diodes. In order to operate the power transistors, gate signals are required. These gate signals are typically generated by gate drive units. The gate signals can be generated individually for each power transistor, or commonly for groups of power transistors, e.g. when the power transistors commonly implement a switching function. Hence, the three-phase two-level power electronics assembly comprises at least one control connector, typically provided as gate connector.

According to a modified embodiment of the invention the set of power electronic devices are arranged in power semiconductor modules, whereby each of the power semiconductor modules comprises multiple power electronic devices. Each power semiconductor module comprises multiple power electronic devices comprises at least one IGBT and at least one power diode, which are chosen and arranged according to the functions and e.g. depending on desired voltage and/or current carrying capabilities. Hence, multiple power semiconductors can be combined in parallel and/or in series within the power semiconductor modules. The power semiconductor modules comprise IGBT modules and diode modules, whereby the IGBT modules typically comprise IGBTs and power diodes and the diode modules comprise power diodes. The power semiconductor modules can be provided as single, double or six packs modules depending on the number of implemented switches. The modules are directly mounted on the base plate. Hence, the modules are typically provided with a heat dissipating face, which is in contact with the second face of the base plate when mounted thereon. Still further, it is also possible to combine different power semiconductor modules and provide these combined power semiconductor modules as power semiconductor modules.

According to a modified embodiment of the invention the power semiconductor modules comprise IGBT modules and diode modules, whereby the rows connected to the three-phase AC output comprise IGBT modules and the rows connected to the chopper DC outputs comprise at least one IGBT module and at least one diode module. The IGBT modules typically comprise IGBTs and power diodes and the diode modules comprise power diodes. The IGBT modules can implement different functionalities depending on the type, number, arrangement or others of the IGBTs. The power semiconductor modules can be provided as single, double or six packs modules depending on the number of implemented switches. The rows connected to the three-phase AC output comprise IGBT modules and the rows connected to the chopper DC outputs comprise at least one IGBT module and at least one diode module as required to implement the switching capability of the three-phase two-level power electronics assembly, in particular for the use in the power converter.

According to a modified embodiment of the invention the heat dissipation unit is provided integrally on the first face of the base plate. Hence, heat introduced into the base plate can be easily dissipated to the heat dissipation unit. Contact faces between the heat dissipation unit and the first face of the base plate are omitted.

According to a modified embodiment of the invention the three-phase two-level power electronics assembly comprises a thermal interface layer, which is provided between the heat dissipation unit and the first face of the base plate. The thermal interface layer can comprise a layer of thermal grease, which is either attached to the first face of the base plate or the heat dissipation unit. The thermal interface layer improves dissipation of heat from the base plate to the heat dissipation unit.

According to a modified embodiment of the invention the three-phase two-level power electronics assembly comprises resistive components, which are mounted on the base plate. Hence, also heat generated by these resistive components can be efficiently dissipated through the base plate. The same refers to power semiconductor modules comprising resistive components. Resistive components typically comprise resistors.

According to a modified embodiment of the invention the three-phase two-level power electronics assembly comprises a housing, which is preferably made of metal sheet. The housing provides an encapsulation of internal components and protects the internal components from damage. It also serves as a carrier for components, which are attached to the housing internally or externally. Preferably, the housing comprises openings for enabling air flow therethrough. Further preferred, the housing comprises air guiding means to direct the air flow to components which are heated more than other components.

According to a modified embodiment of the invention the three-phase two-level power electronics assembly comprises at least one gate drive unit for driving at least one of the power electronic devices, whereby the at least one gate drive unit is arranged at the housing. The gate drive units generate gate signals for power transistors, in particular IGBTs. In particular, the gate drive units generate gate signals commonly for the IGBT of one power semiconductor module. The gate drive units generate gate drive signal for each power semiconductor module individually or commonly for at least some power semiconductor modules or even for all power semiconductor modules.

Further preferred, the at least one gate drive unit is mounted at one of the long sides of the housing. With the three-phase two-level power electronics assembly comprising five rows of power electronic devices, typically each row of power electronic devices comprising two power electronic devices, the three-phase two-level power electronics assembly has an elongated shape with its long side being formed perpendicular to the rows of power electronic devices. Hence, the gate drive units can be located close to the rows of power electronic devices, which are controlled by the gate signals generated in the respective gate drive units.

Still further preferred, the three-phase two-level power electronics assembly comprises one gate drive unit for each row of power electronic devices. Still further preferred, the three-phase two-level power electronics assembly comprises one gate drive unit for each power electronic device with switching capability, either a power semiconductor or a power semiconductor module. Hence, in a configuration with five half-bridges, whereby the three half-bridges of the three-phases connected to the respective AC outputs comprise each two power transistor modules or IGBT modules, and the two half-bridges of the DC chopper connected to the respective DC chopper outputs comprise each one power transistor module or IGBT module and one power diode module, a total of eight gate drive units is provided. Preferably, in accordance with the arrangement of the power transistor modules or IGBT modules, the gate drive units are arranged at both opposite lateral long sides of the housing. In particular five gate drive units are arranged at a front side also comprising the connectors, and three gate drive units are arranged at the back side. This ensures a good accessibility of the gate drive units. The gate drive units are preferably protected individually or at least some of them commonly by a cover, e.g. a cover made from metal. On the front side, the power terminals for different potentials AC1, AC2, AC3, BC1, BC2, DC+, DC− are preferably supported by this cover. The gate drive units are preferably mounted on an insulated support providing insulation distances and EMI shielding for reliable operation.

According to a modified embodiment of the invention the three-phase two-level power electronics assembly comprises a control device for controlling the operation of the at least one gate drive unit, which is arranged at the housing. Hence, together with the at least one gate drive unit, the three-phase two-level power electronics assembly can be provided as an integral device, e.g. in the kind of a module, which can be easily used for different applications and e.g. in differently sized power converters. The control device is preferably installed on one of the short sides of the three-phase two-level power electronics assembly. The control device preferably communicates with other controllers, e.g. a central controller of the power converter, or control devices of other three-phase two-level power electronics assemblies. Hence, the power converter preferably comprises fiber optic or copper wire links for communication. Furthermore, the control device can communicate with other components of the three-phase two-level power electronics assembly, e.g. current sensors. A control interface of the power converter, in particular of its control device, can be simplified and independent from project-specific changes on a customer interface.

The three-phase two-level power electronics assembly preferably comprises at least one power supply mounted at the housing. The at least one power supply provides the energy for the control device. Preferably, the at least one power supply also powers additional components like gate drive units, current sensors, or others. The at least one power supply is mounted onto the metal construction along one of the large sides of the module unit, preferably at the back side opposite to the front side, where the connectors are located. In an arrangement like this a volume of the housing is used in a very efficient way, short cable connections are possible and the access to its components can be easily obtained.

Overall, based on the housing, the three-phase two-level power electronics assembly can be provided as an integral device, e.g. in the kind of a module, which can be easily used for different applications and e.g. in differently sized power converters. The module can be provided to be easily replaced, e.g. when employed in power converters, which facilitates maintenance. Hence, the three-phase two-level power electronics assembly can be provided with at least one component out of the afore described gate drive unit, power supply, current sensor, control device, or others.

According to a modified embodiment of the invention the three-phase two-level power electronics assembly comprises a busbar, which is connected to at least one connector and at least one of the power electronic devices, whereby the busbar extends on top of the power electronic devices. One pole of the DC link is connected with the busbar to provide positive or negative DC power. The position of the power electronic device on the base plate is optimized together with the busbar to reduce the busbar size. Also a number of openings therein shall be reduced. Preferably, the busbar is also connected to at least one storage capacitor for buffering the DC link. The shape of the busbar is essentially rectangular with the DC connections for the power electronic devices being provided along a long side of the busbar. The long side of the busbar corresponds with the long side of the three-phase two-level power electronics assembly. Low inductance of the busbar is essential for a good switching behavior of the power electronic components, since it allows the three-phase two-level power electronics assembly to operate at high DC link voltages and switching frequencies. The busbar is preferably a laminated type busbar comprising one positive layer, one negative layer, and one layer per AC phase. The layers are preferably flat and thin and parallel to each other with insulation in between forming a low-inductive electrical connection between the power semiconductor devices and the DC link including the storage capacitors. Further preferred, a number of layers and openings for electrical connections is also kept small.

According to a modified embodiment of the invention the three-phase two-level power electronics assembly comprises at least one storage capacitor for buffering the connectors for connecting to the poles of the DC link, whereby the at least one storage capacitor is arranged on top of the power electronic devices. The storage capacitors are preferably stapled to reduce space requirements of the DC link buffer.

According to an embodiment of the invention, the storage capacitors are installed above the busbar to achieve a compact design. The number of capacitors is variable to cover different application requirements.

According to a modified embodiment of the invention the three-phase two-level power electronics assembly comprises at least one current sensor, which is provided to measure the current through at least one connector. With the measured current, control of the three-phase two-level power electronics assembly can be improved. Further preferred, the at least one current sensor is connected to the control device of the three-phase two-level power electronics assembly to enable an efficient control with simple connections.

According to a modified embodiment of the invention the power converter comprises a forced air-cooling for cooling the least one three-phase two-level power electronics assembly. Forced air-cooling generally improves cooling performance, so that temperature requirements can be easily fulfilled.

BRIEF DESCRIPTION OF DRAWINGS

These and other aspects of the invention will be apparent from and elucidated with reference to the embodiments described hereinafter.

In the drawings.

DETAILED DESCRIPTION OF THE INVENTION

Figure 1:
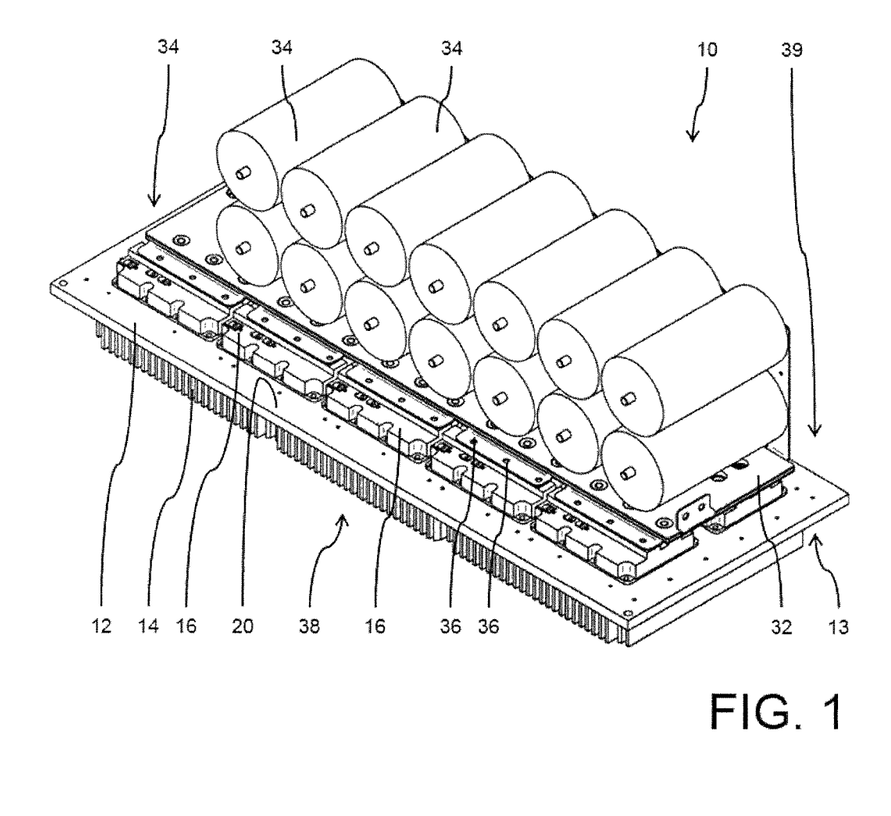
FIG. 1 shows a three-phase two-level power electronics assembly in accordance with a first, preferred embodiment of the invention in a perspective view with open housing.
Figure 2:
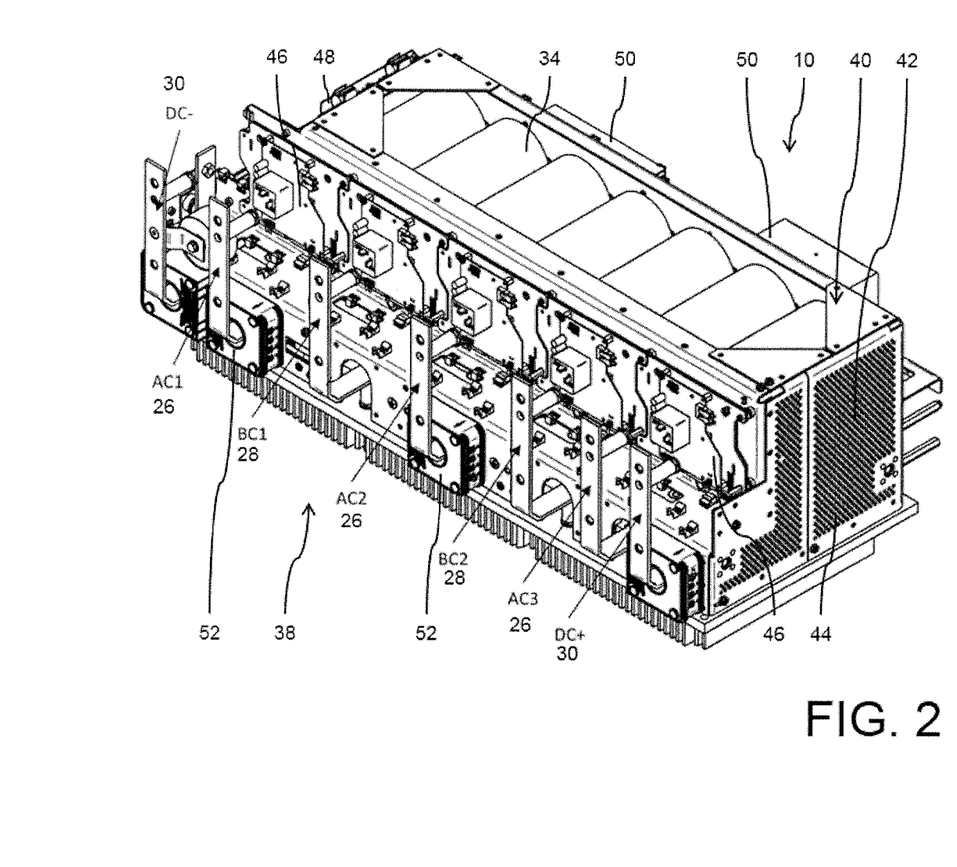
FIG. 2 shows the three-phase two-level power electronics assembly in accordance with the first embodiment in a perspective view with closed housing.

FIGS. 1 and 2 show a three-phase two-level power electronics assembly 10 in accordance with a first, preferred embodiment of the invention. The three-phase two-level power electronics assembly 10 comprises a thermally conductive base plate 12, a heat dissipation unit 14, mounted on a first face 13 of the base plate 12, connectors 26, 28, 30 for three-phase AC output AC1, AC2, AC3, chopper DC outputs BC 1, BC2, and two poles of a DC link DC+, DC−, respectively, and a set of power electronic devices 16, 18 mounted on a second face 20 of the base plate 12.

According to the first embodiment the three-phase two-level power electronics assembly 10 comprises a thermal interface layer, which is not visible in the figures, and which is provided between the first face 13 of the base plate 12 and the heat dissipation unit 14. The thermal interface layer comprises a layer of thermal grease, which is attached to the first face 13 of the base plate 12.

In an alternative embodiment, the heat dissipation unit 14 is provided integrally with the base plate 12.

The heat dissipation unit 14 in this embodiment is an air cooling heat dissipation unit.

The power electronic devices 16, 18 comprise eight IGBT modules 16 and two diode modules 18. The eight IGBT modules 16 and the two diode modules 18 are arranged in five rows 22 and two columns 24 on the base plate 12, as can be best seen in FIG. 3.

Figure 3:
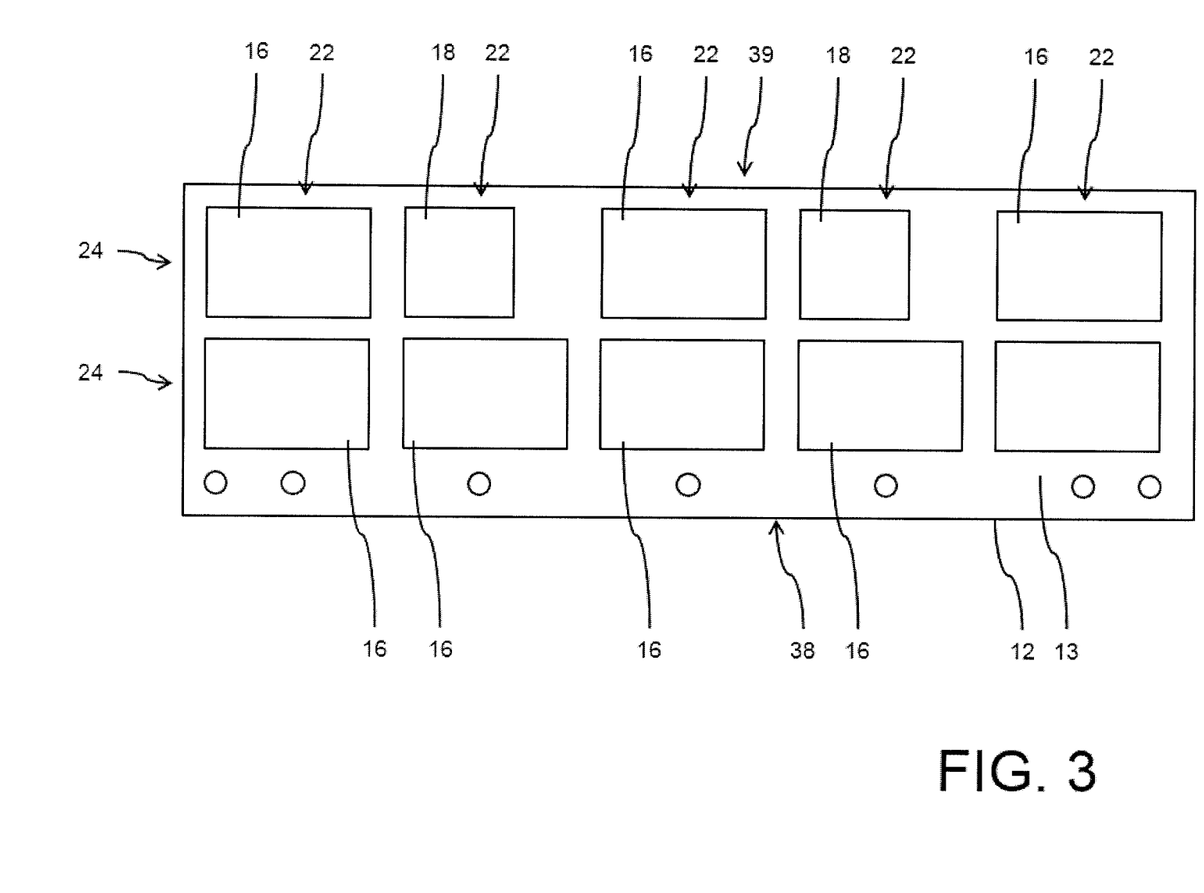
FIG. 3 shows a base plate of the three-phase two-level power electronics assembly in accordance with the first embodiment with power semiconductor modules mounted thereon in a schematic top view.

The eight IGBT modules 16 and the two diode modules 18 are arranged in half-bridges according to their functions, whereby each half-bridge is implemented by one row 22 on the second face 13 of the base plate 14. The IGBT modules 16 comprise IGBTs and power diodes, and the diode modules 18 comprise power diodes.

The power electronic devices 16, 18 in this embodiment are connected to provide a three phase AC output AC1, AC2, AC3 as well as chopper DC outputs BC 1, BC2 at the respective AC connectors 26 and chopper connectors 28 of the three-phase two-level power electronics assembly 10.

As can be clearly seen in FIG. 3, the rows 22 connected to the three-phase AC output AC1, AC2, AC3 and the rows 22 connected to the chopper DC outputs BC1, BC2 are alternately arranged on the base plate 14. The rows 22 connected to the three-phase AC output AC1, AC2, AC3 can be easily distinguished from the rows 22 connected to the chopper DC outputs BC1, BC2, since the rows 22 connected to the chopper DC outputs BC1, BC2 comprises one diode module 18 and one IGBT module 16, whereas the rows 22 connected to the three-phase AC output AC1, AC2, AC3 comprise two IGBT modules 16, whereby the size of the diode modules 18 is typically smaller than the size of the IGBT modules 18.

The three-phase two-level power electronics assembly 10 comprises DC link connectors 30 for two poles of a DC link DC+, DC−. The DC link DC+, DC− serves as power source for the three-phase two-level power electronics assembly 10 and is connected to the power electronic devices 16, 18.

The three-phase two-level power electronics assembly 10 comprises a busbar 32, which is a laminated type busbar 32 comprising one positive layer, connected to DC+ of the DC link DC+, DC−, one negative layer, connected to DC− of the DC link DC+, DC−, and one layer per AC output AC1, AC2, AC3. The layers of the busbar 32 are accordingly connected to the respective connectors 26, 28, 30. The layers of the busbar 32 are provided flat and thin and parallel to each other with an insulation layer in between.

The busbar 32 is further connected to the power electronic devices 16, 18 and extends on top of the power electronic devices 16, 18. The busbar 32 is further connected to storage capacitors 34 for buffering the connectors 30 for connecting to the two poles of the DC link the DC link DC+, DC−. The storage capacitors 34 are stapled on top of the power electronic devices 16, 18.

The shape of the busbar 32 is essentially rectangular with the DC connections 36 for the power electronic devices 16, 18 being provided along a long side 38, 39 of the busbar 32. The long sides 38, 39 of the busbar 32 correspond with the long sides 38, 39 of the three-phase two-level power electronics assembly 10.

The three-phase two-level power electronics assembly 10 comprises a housing 40, which is made of metal sheet. The housing 40 comprises lateral openings 42 for enabling air flow therethrough. The openings 42 in this embodiment are covered by grid metal sheet 44.

The three-phase two-level power electronics assembly 10 further comprises eight gate drive units 46, which are attached to the housing 44. The gate drive units 46 provide gate signals for switching the IGBTs if the IGBT modules 18.

The gate drive units 46 generate gate drive signal for each IGBT module 18 individually. Hence, eight gate drive units 46 are mounted at both opposite lateral long sides 38, 39 of the housing 40, whereby the long sides 38, 39 are the sides arranged perpendicular to the rows 22 of power electronic devices 16, 18. The gate drive units 46 are located close to the rows 22 of power electronic devices 16, 18, which are controlled by the gate signals generated in the respective gate drive units 46. In particular five gate drive units 46 are arranged at a front side 38, a can be seen in FIG. 2, and three gate drive units 46 are arranged at a back side 39. The gate drive units 46 are in a way not shown in the figures mounted on an insulated support on the housing 40.

The three-phase two-level power electronics assembly 10 further comprises a control device 48 for controlling the operation of the gate drive units 46. The control device 48 is arranged at a short side 49 of the three-phase two-level power electronics assembly 10. When mounted in a power converter, the control device 48 communicates with a central controller of the power converter and control devices 48 of other three-phase two-level power electronics assemblies 10 via fiber optic links.

The three-phase two-level power electronics assembly 10 also comprises seven current sensors 52 for each connector 26, 28, 30 mounted at the housing 40 to measure the current through the respective connectors 26, 28, 30. The current sensors 52 are connected to the control device 48 of the three-phase two-level power electronics assembly 10.

The three-phase two-level power electronics assembly 10 also comprises a power supply 50 mounted at the housing 40. The power supply 50 provides the energy for the control device 48, the gate drive units 46, current sensors 52, and others. The power supply 50 is mounted onto the housing 40 along one of its long sides 38, 39, which is the back side 39 in this embodiment.

A power converter in accordance with the first embodiment, which is not explicitly shown in the figures, comprises multiple of the above three-phase two-level power electronics assemblies 10. The power converter comprises a forced air-cooling for cooling the three-phase two-level power electronics assemblies 10.

The reference symbols used in the drawing and their meanings are listed in summary form in the list of reference symbols. In principle, the same parts are provided with the same reference symbols throughout the figures. The described embodiments represent examples of the subject matter of the invention and do not have any restrictive effect.

While the invention has been illustrated and described in detail in the drawings and foregoing description, such illustration and description are to be considered illustrative or exemplary and not restrictive; the invention is not limited to the disclosed embodiments. Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

REFERENCE SIGNS LIST 10 three-phase two-level power electronics assembly
12 heat dissipation unit
13 first face
14 base plate
16 IGBT module, power electronic device
18 diode module, power electronic device
20 second face
22 row
24 column
26 AC connector
28 chopper DC connector
30 DC link connector
32 busbar
34 storage capacitor
36 connections
38 long side, front side
39 long side, back side
40 housing
42 opening
44 grid metal sheet
46 gate drive unit
48 control device
49 short side
50 power supply
52 current sensor
AC1 AC output
AC2 AC output
AC3 AC output BC1 chopper DC output
BC2 chopper DC output
DC+ DC link
DC− DC link

The invention claimed is:

1. Three-phase two-level power electronics assembly comprising
a thermally conductive base plate,
a heat dissipation unit, mounted on a first face of the base plate,
connectors for three-phase AC output, chopper DC outputs, and two poles of a DC link, and
a set of power electronics devices mounted on a second face of the base plate, whereby the power electronic devices are arranged within the three-phase two-level power electronics assembly in rows to provide a three phase AC output as well as chopper DC outputs and connected to the respective connectors,
wherein
the rows connected to the three-phase AC output and the rows connected to the chopper DC outputs are alternately arranged on the base plate.

2. Three-phase two-level power electronics assembly according to claim 1,
wherein
the set of power electronic devices comprises power transistors, in particular IGBTs, and power diodes.

3. Three-phase two-level power electronics assembly according to claim 2, wherein the set of power electronics devices are arranged in power semiconductor modules, whereby each of the power semiconductor modules comprises multiple power electronic devices.

4. Three-phase two-level power electronics assembly according to claim 3, wherein the power semiconductor modules comprise IGBT modules and diode modules, whereby the rows connected to the three-phase AC output comprise IGBT modules and the rows connected to the chopper DC outputs comprise at least one IGBT module and at least one diode module.

5. Three-phase two-level power electronics assembly according to claim 2, wherein the heat dissipation unit is provided integrally on the first face of the base plate.

6. Three-phase two-level power electronics assembly according to claim 1,
wherein
the set of power electronics devices are arranged in power semiconductor modules, whereby each of the power semiconductor modules comprises multiple power electronic devices.

7. Three-phase two-level power electronics assembly according to claim 6,
wherein
the power semiconductor modules comprise IGBT modules and diode modules, whereby the rows connected to the three-phase AC output comprise IGBT modules and the rows connected to the chopper DC outputs comprise at least one IGBT module and at least one diode module.

8. Three-phase two-level power electronics assembly according to claim 7, wherein the heat dissipation unit is provided integrally on the first face of the base plate.

9. Three-phase two-level power electronics assembly according to claim 6, wherein the heat dissipation unit is provided integrally on the first face of the base plate.

10. Three-phase two-level power electronics assembly according to claim 1,
wherein
the heat dissipation unit is provided integrally on the first face of the base plate.

11. Three-phase two-level power electronics assembly according to claim 1,
wherein
the three-phase two-level power electronics assembly comprises a thermal interface layer, which is provided between the heat dissipation unit and the first face of the base plate.

12. Three-phase two-level power electronics assembly according to claim 1,
wherein
the three-phase two-level power electronics assembly comprises resistive components, which are mounted on the base plate.

13. Three-phase two-level power electronics assembly according to claim 1,
wherein
the three-phase two-level power electronics assembly comprises a housing, which is preferably made of metal sheets.

14. Three-phase two-level power electronics assembly according to claim 13,
wherein
the three-phase two-level power electronics assembly comprises at least one gate drive unit for driving at least one of the power electronic devices, whereby the at least one gate drive unit is arranged at the housing.

15. Three-phase two-level power electronics assembly according to claim 14,
wherein
the three-phase two-level power electronics assembly comprises a control device for controlling the operation of the at least one gate drive unit, which is arranged at the housing.

16. Three-phase two-level power electronics assembly according to claim 1,
wherein
the three-phase two-level power electronics assembly comprises a busbar, which is connected to at least one connector and at least one of the power electronic devices, whereby the busbar extends on top of the power electronic devices.

17. Three-phase two-level power electronics assembly according to claim 1,
wherein
the three-phase two-level power electronics assembly comprises at least one storage capacitor for buffering the connectors for connecting to the poles of the DC link,
whereby the at least one storage capacitor is arranged on top of the power electronic devices.

18. Three-phase two-level power electronics assembly according to claim 1,
wherein
the three-phase two-level power electronics assembly comprises at least one current sensor,
which is provided to measure the current through at least one connector.

19. Three-phase two-level power electronics assembly of claim 1, which includes two three-phase two-level power electronics assemblies within a Power converter.

20. Three-phase two-level power electronics assembly of claim 19,
wherein the power converter comprises a forced air cooling for cooling the at least one three-phase two-level power electronics assembly.

\* \* \* \* \*